US006690186B2

(12) United States Patent
Fjelstad

(10) Patent No.: US 6,690,186 B2
(45) Date of Patent: Feb. 10, 2004

(54) METHODS AND STRUCTURES FOR ELECTRONIC PROBING ARRAYS

(75) Inventor: Joseph Fjelstad, Sunnyvale, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/999,615

(22) Filed: Oct. 24, 2001

(65) Prior Publication Data

US 2002/0075016 A1 Jun. 20, 2002

Related U.S. Application Data

(60) Division of application No. 09/405,029, filed on Sep. 24, 1999, now Pat. No. 6,499,216, which is a continuation-in-part of application No. 09/267,058, filed on Mar. 12, 1999, now Pat. No. 6,117,694, which is a continuation-in-part of application No. 09/138,858, filed on Aug. 24, 1998, now Pat. No. 6,104,087, which is a division of application No. 08/440,665, filed on May 15, 1995, now Pat. No. 5,801,441, which is a division of application No. 08/271,768, filed on Jul. 7, 1994, now Pat. No. 5,518,964, said application No. 09/267,058, is a continuation-in-part of application No. 08/989,312, filed on Dec. 12, 1996, now Pat. No. 5,989,936, said application No. 09/405,029, is a continuation-in-part of application No. 08/999,758, filed on Nov. 26, 1997, now Pat. No. 5,983,492.
(60) Provisional application No. 60/101,766, filed on Sep. 25, 1998, provisional application No. 60/077,928, filed on Mar. 13, 1998, and provisional application No. 60/032,828, filed on Dec. 13, 1996.

(51) Int. Cl.[7] .............................................. G01R 1/073
(52) U.S. Cl. ....................... 324/762; 324/754

(58) Field of Search ............................... 324/754, 757, 324/758, 765, 762

(56) References Cited

U.S. PATENT DOCUMENTS

| 4,566,184 A | 1/1986 | Higgins et al. |
| 4,757,256 A | 7/1988 | Whann et al. |
| 4,766,371 A | * 8/1988 | Moriya ........................ 324/763 |
| 4,837,622 A | 6/1989 | Whann et al. |
| 4,998,885 A | 3/1991 | Beaman |

(List continued on next page.)

Primary Examiner—Ernest Karlsen
(74) Attorney, Agent, or Firm—Lerner, David, Littenberg, Krumholz & Mentlik, LLP

(57) ABSTRACT

A probe card for testing an electrical element such as a semiconductor wafer or a printed wiring board includes a substrate with circuitry thereon, an encapsulant layer overlying the substrate and a multiplicity of leads extending upwardly from the substrate through the encapsulant layer to terminals, the terminals projecting above the encapsulant layer. The probe card can be engaged with the electronic element so that the tips of the leads bear on the contact pads of the electronic element, and so that the leads and encapsulant layer deform to accommodate irregularities in the electronic element or probe card. The card can be made by providing the substrate, a sacrificial layer and leads extending between the sacrificial layer and substrate, moving the substrate and sacrificial layer away from one another to deform the leads and injecting a curable material around the leads to form the encapsulant layer.

7 Claims, 7 Drawing Sheets

U.S. PATENT DOCUMENTS

| | | | |
|---|---|---|---|
| 5,014,161 A | * 5/1991 | Lee et al. | ............... 361/709 |
| 5,062,203 A | 11/1991 | Miller et al. | |
| 5,070,297 A | 12/1991 | Kwon et al. | |
| 5,123,850 A | 6/1992 | Elder et al. | |
| 5,148,265 A | 9/1992 | Khandros et al. | |
| 5,148,266 A | 9/1992 | Khandros et al. | |
| 5,177,439 A | 1/1993 | Liu et al. | |
| 5,225,037 A | 7/1993 | Elder et al. | |
| 5,239,260 A | 8/1993 | Widder et al. | |
| 5,414,298 A | 5/1995 | Grube et al. | |
| 5,436,568 A | 7/1995 | Woith | |
| 5,455,390 A | 10/1995 | DiStefano et al. | |
| 5,491,427 A | 2/1996 | Ueno et al. | |
| 5,500,604 A | 3/1996 | Swarbrick et al. | |
| 5,513,430 A | 5/1996 | Yanof et al. | |
| 5,518,964 A | 5/1996 | DiStefano et al. | |
| 5,525,545 A | 6/1996 | Grube et al. | |
| 5,532,610 A | * 7/1996 | Tsujide et al. | ............... 324/754 |
| 5,613,861 A | 3/1997 | Smith et al. | |
| 5,623,213 A | 4/1997 | Liu et al. | |
| 5,625,298 A | 4/1997 | Hirano et al. | |
| 5,679,977 A | 10/1997 | Khandros et al. | |
| 5,701,666 A | * 12/1997 | DeHaven et al. | ............ 324/754 |
| 5,801,441 A | 9/1998 | DiStefano et al. | |
| 5,897,326 A | 4/1999 | Eldridge et al. | |
| 5,926,951 A | 7/1999 | Khandros et al. | |
| 5,974,662 A | 11/1999 | Eldridge et al. | |
| 5,983,492 A | 11/1999 | Fjelstad | |
| 5,983,493 A | 11/1999 | Eldridge et al. | |
| 5,989,936 A | 11/1999 | Smith et al. | |
| 5,998,228 A | 12/1999 | Eldridge et al. | |
| 6,029,344 A | 2/2000 | Khandros et al. | |

* cited by examiner

METHODS AND STRUCTURES FOR ELECTRONIC PROBING ARRAYS

CROSS-REFERENCE TO RELATED APPLICATIONS

The present application is a divisional of U.S. patent application Ser. No. 09/405,029, filed Sep. 24, 1999, now U.S. Pat. No. 6,499,216, which in turn claims benefit of U.S. Provisional Patent Application No. 60/101,766, filed Sep. 25, 1998, the disclosure of which is hereby incorporated by reference herein. Said application Ser. No. 09/405,029 is a continuation in part of U.S. patent application Ser. No. 09/267,058, filed Mar. 12, 1999, now U.S. Pat. No. 6,117,694, the disclosure of which is hereby incorporated by reference herein, which in turn claims benefit of U.S. Provisional Patent Application No. 60/077,928, filed Mar. 13, 1998, the disclosure of which is also incorporated by reference herein. Said U.S. patent application Ser. No. 09/267,058, is a continuation-in-part of U.S. patent application Ser. No. 09/138,858, filed Aug. 24, 1998, now U.S. Pat. No. 6,104,087, which in turn is a divisional of U.S. patent application Ser. No. 08/440,665, filed May 15, 1995, now U.S. Pat. No. 5,801,441, which in turn is a divisional of U.S. patent application Ser. No. 08/271,768, filed Jul. 7, 1994, now U.S. Pat. No. 5,518,964, the disclosures of which are hereby incorporated by reference herein. Said U.S. patent application Ser. No. 09/267,058 is also a continuation-in-part of U.S. patent application Ser. No. 08/989,312, filed Dec. 12, 1996, now U.S. Pat. No. 5,989,936, the disclosure of which is also incorporated by reference herein, which in turn claims benefit of U.S. Provisional Patent Application No. 60/032,828, filed Dec. 13, 1996, the benefit of which is claimed herein and the disclosure of which is also incorporated by reference herein. Said application Ser. No. 09/405,029 is also a continuation in part of U.S. patent application Ser. No. 08/999,758, filed Nov. 26, 1997, now U.S. Pat. No. 5,983,492, the disclosure of which is hereby incorporated by reference herein.

BACKGROUND OF THE INVENTION

Semiconductor chips are typically manufactured en masse in so called wafers. Each such wafer is made of a semiconductor material and typically is four to twelve inches in diameter. Each wafer typically contains a plurality of identical chips each connected and adjacent one another, but separated by portions of the wafer called scribe lines. The scribe lines do not contain devices which are required in the finished chips. Eventually, such individual chips are separated (or "diced") from one another for packaging and/or electrical connection to other chips. Prior to such further processing and connection, however, such chips need to be tested in order to determine which chips are defective so that further expense in processing does not occur on such defective chips. Such testing is typically called "probing." This testing may be accomplished by testing a single chip or multiple chips in defined rows on the wafer, and then repeating the testing operation with other chips or rows. Alternatively, the chips may be separated from one another first and then tested individually. Typically, probe contacts are abutted against (and preferably gently scrubbed or scraped against) respective chip contacts so that the chip circuitry may be tested. The process of testing one chip or a few chips at a time is slow and hence costly. Recently, simultaneous testing of a full undiced wafer has been discussed and is being tried by several manufacturers.

When probing chips or wafers, it is important to have a planar set of probe contacts so that each probe contact can make simultaneous electrical contact to a respective chip contact. It is also important to have the contacts on the wafer coplanar. Typically, if the tips of the probe contacts do not lie in approximately the same plane, or if some of the contacts on the wafer are out of plane, more force must be exerted on the back of the probe in an effort to engage all of the probe contacts with the chip contacts. This typically leads to non-uniform forces between the tips of the probe contacts and the wafer contacts. If too much force is placed on any one probe contact, there is a potential to harm the chip contacts. Planarity and a balanced probe contact force is also important in order to have approximately the same ohmic resistance across all of the probe contacts so that the electrical signals have approximately the same level of integrity. Maintaining similar ohmic probe to chip contact resistance is especially important for accurate testing of chips that are designed to be run at high speeds. For such high speed chips, it is also important to control the impedance of the probe tester (resistance, capacitance & inductance) as a whole to maintain the integrity of the electrical signals.

U.S. Pat. No. 4,566,184 discloses a probe card that has a board with an aperture in it. The board has conductive traces on a top surface. A bottom surface of the board has a conductive layer which is used as a ground layer. The conductive traces are connected to electroplated probe contacts that are located below the board aperture and connected to the traces by way of wire bonded connections. The assembly is encapsulated (such as by an acrylic potting compound) in order to hold the probe contacts in place and protect the wire bonds. The wire bonded wires connecting the probe board to the contacts provide an uncontrolled impedance paths that will introduce added inductance into the probe system. Also, because of the limitations inherent with such wire bonded connections, it would be difficult to make connections to high density chip contacts and area array chip contacts without substantial fear that the wires would short against each other.

U.S. Pat. Nos. 4,757,256 and 4,837,622 disclose a probe tester that makes use of an array of cantilevered, resilient wires each of which extends from the surface of the probe card downwardly towards the chip contacts. The probe contact array includes an annular frame, and two sets of spaced apart probe wires bonded to the annular frame by a curable resin material. The probes are bonded in alignment position relative to respective connection pads formed on each of the chips on the wafer for individual testing of chips on an undiced wafer. The adjacent probe wires of both sets are substantially parallel with each other, one set of probe wires being spaced apart from the other set. One set of probes is adapted for electrical connection to the first set of traces on the lower surface, and the other set of probes is adapted for electrical connection to the second set of traces on the upper surface of the printed circuit probe card, in all cases by way of the lower surface thereof. This type of probe card had difficulty when the center-to-center distance ("pitch") of the chip contacts becomes fairly small or when the contacts are not located on a periphery of the chip itself. Also, the distended wires may cause excessive scrubbing of the chip contacts and shorting of adjacent probe wires during testing or handling of the probe card. U.S. Pat. No. 5,613,861 discloses a spring contact probe that eliminates the need to create uniform solder bumps or uniform contacting pressure. The spring contacts are formed of a thin metal strip which is in part fixed to a substrate and electrically connected to a contact pad on the substrate. The free portion of the metal strip not fixed to the substrate bends up and away from the substrate because of a stress gradient formed into it. When the contact pad on a device is brought into pressing contact with the free portion of the metal strip, the free portion deforms and provides compliant contact with the contact pad. Since the metal strip is electrically conductive or coated with a conductive material, the contact pad on the substrate is electrically connected to the contact pad on the device via the spring contact.

U.S. Pat. No. 5,177,439 discloses an interface probe card for testing unencapsulated semiconductor devices. The probe card is manufactured from a semiconductor substrate material. A plurality of protrusions is formed in the top surface of the substrate. Each protrusion is coated with a layer of conducting material. The protrusions are patterned to match either a peripheral or an area array of electrode pads on the device to be tested. Conductive interconnects couple each of the plurality of coated protrusions to an external test system. The probe card design disclosed in this patent has the benefit of using semiconductor type equipment for its manufacture but makes a somewhat rigid connection during a probe operation.

U.S. Pat. No. 5,513,430 discloses a method for manufacturing a probe card. A layer of resist is formed on a plating base. The layer of resist is exposed to radiation and developed to provide angled, tapered openings exposing portions of the plating base, such as by using x-ray radiation. An electrically conductive material is electroplated on the exposed portions of the plating base and fills the angled, tapered openings. The layer of resist and portions of the plating base between the electroplated conductive material are removed. The electrically conductive material forms the probe card probes which are angled and tapered. In addition, the compliant probe card probes may be stair-step shaped if more conventional UV radiation is used in defining the tapered openings in the plating base.

U.S. Pat. No. 5,070,297 discloses a wafer level probe tester where all of the chips are tested simultaneously prior to a dicing operation. The disclosed probe tester is created using standard wafer processing techniques to embed active testing and interfacing circuitry in the probe's base silicon substrate. Each probe tester has a plurality of probe contacts or tips that are electrically connected to the probe tester's circuitry. In this disclosure, probe tester may also have memory for storing the probe data after the probe tester has probed a wafer. While the ability to have internal circuitry in the probe tester potentially increases the ability to test the chips in the wafer at higher speeds, it has the drawback of requiring extra processing of the tester's base substrate. As more and more circuitry is added across the face of the tester's base substrate, the probe tester encounters the same problems encountered in the field with wafer-scale integration techniques, namely the yield of the circuitry within the base substrate will be adversely affected as more circuitry is added to the base substrate. The problem usually occurs when very high yielding circuitry is used with lower yielding circuitry. The aggregate yield of the resulting circuitry is never any higher than the lowest yielding circuitry, leading to a more expensive process and structure.

Bumped flex test technology has been used by several manufacturers (also known as "membrane probe card technology"). Test circuits are created on a membrane, such as a thin flexible polymeric substrate or silicon substrate. Typically such test circuits are limited to diameters of approximately 3 inches and incorporate bump contact feature sizes of 50 microns minimum line and space. Such feature sizes are necessary to access the I/O lands of the IC device. Such contact bumps can be as small as 50 microns in both diameter and height. The simplest method of creating the contact bumps is by deforming the metal from the back side by use of a forming die consisting of pins that are located where the contact bumps are to be located. This method works very effectively but is limited in terms of minimum size of the bump that can be produced and in terms of performance because the cavity created during the bump formation can be a source of weakness. In addition, such contact bumps normally must be over plated after the forming process with a suitable contact finish such as gold. This is not only cumbersome but can add to whatever non-planarity that was present in the part initially. Another method used for creating the bumps, especially microbumps or metal contact bumps having dimensions of less than 250 microns across and rising 25 to 100 microns above the surface, is to uniformly plate up the bumps from the surface of the conductor. This has been performed by several manufacturers and is the method of choice for creating uniform contact bumps. These methods for creating a membrane probe card have been seen as either cost prohibitive or have been viewed as impractical for testing of printed circuit boards ("PCBs"). This is due perhaps to the intrinsically high cost of the test circuits and the small and delicate nature of the test circuits. Another membrane probe tester for testing unpackaged chips having flip chip solder balls attached to their contacts is shown in U.S. Pat. No. 5,062, 203 ("'203 patent"). The '203 patent does not make use of the aforementioned bump contacts because they can deform or damage the flip chip solder balls on the chip's contacts and typically have a difficult time maintaining contact with the solder ball's curved surface. Instead, this reference uses a thin film of flexible material having recessed conductive vias so that the tips of each solder ball can be captured therein. Other flex based probe card solutions are disclosed in U.S. Pat. Nos. 5,123,850; 5,225,037; 5,436,568; 5,491, 427; 5,500,604; 5,623,213; 5,625,298; 5,239,260.

The technology disclosed in commonly assigned U.S. Pat. Nos. 5,148,265; 5,148,266; 5,414,298; 5,455,390; 5,518, 964; and 5,525,545 is also relevant to the present invention. The disclosures in all such recited commonly assigned patents are hereby incorporated by reference herein.

Notwithstanding the positive results of the aforementioned commonly owned inventions, still further improvements would be desirable.

SUMMARY OF THE INVENTION

One aspect of the present invention provides methods of making probe cards. Preferred methods according to this aspect of the present invention include the step of providing a sacrificial layer, a substrate having electrical circuits thereon and a plurality of elongated leads. Each lead has a first end connected to the sacrificial layer and a second end attached to the substrate and connected to the circuits thereon. The first ends of at least some of the leads are physically connected to the first ends of others of the leads by the sacrificial layer. The method further includes the step of moving the substrate and the sacrificial layer away from one another so as to bend the second ends of the leads away from the sacrificial layer while leaving the first ends of the leads in position on the sacrificial layer. Preferably a flowable material is injected around the leads during or after the moving step and cured so as to form a dielectric encapsulant layer surrounding the leads. The sacrificial layer typically is removed by dissolving or eroding the layer.

In one preferred embodiment, the step of providing the sacrificial layer includes the step of providing the sacrificial layer with electrically conductive terminals at a bottom surface of the layer. These terminals are connected to the first ends of the leads. The sacrificial layer protects these terminals from the flowable material during injection of the flowable material. Desirably, the step of providing the terminals includes the step of forming the terminals on the sacrificial as, for example, by placing electrically conductive material into cavities in the sacrificial layer so that the terminals project upwardly from the bottom surface of the sacrificial layer. In this arrangement, the terminals will project above the encapsulant layer when the sacrificial layer is removed. Desirably, the sacrificial layer is provided with the leads thereon, and the leads may be integral with the terminals. For example, the leads and the terminals may be formed in a single metal-depositing step. The cavities in the sacrificial layer may include sharp features so that the electrically conductive material deposited into the cavities forms a short feature such as points on the terminals.

The leads may be formed solely from one or more metals, as, for example, from metals such as gold, copper or combinations thereof. The terminals may include the aforesaid conductive metals and may also include one or more hard metals such as osmium, rhodium and the like. The leads may include polymeric strips as well as conductive strips.

The encapsulant layer may be a compliant material. Also, the method may further include the step of forming channels in the encapsulant layer so as to subdivide the encapsulant layer into different portions of the encapsulant layer surrounding different ones of the leads. This facilitates movement of leads and terminals associated with different portions of the encapsulant independent of one another, and makes it easier for the terminals to conform to the contact pads on the electronic element.

Further aspects of the invention provide probe cards for testing electronic elements. A probe card in accordance with this aspect of the invention desirably includes a substrate having electrical circuitry thereon, an encapsulant layer overlying the substrate and a plurality of flexible leads extending through the encapsulant layer. Desirably, the terminal project above the encapsulant layer and are exposed for engagement with contact pads on an electronic element such as semiconductor device. The terminals desirably have sharp features such as points or edges for engaging the contact pads on the electronic element. Also, the encapsulant layer desirably has channels therein subdividing the encapsulant layer into portions associated with the different leads. For example, a single lead, or a few leads, maybe provided within each portion. The various portions of the encapsulant layer desirably are deformable independently one of one another. The terminals maybe physically connected to one another solely by the encapsulant layer, leads and substrate. Alternatively, the probe card may include a flexible dielectric layer overlying the encapsulant layer, the electric layer having a top surface facing away from the encapsulant layer and substrate. In this embodiment, the terminals may be attached to the flexible dielectric layer and may protrude therethrough so that the terminals are project above the top surface of the flexible dielectric layer.

Yet another aspect of the present invention provides methods of testing electronic elements. A method according to this aspect of the invention includes the step of providing a probe incorporating a substrate with electrical circuitry, an encapsulant layer overlying a surface of the substrate and leads extending upwardly from the substrate through the encapsulant layer, the leads having terminals remote from the substrate projecting from the encapsulant layer, and temporarily engaging the terminals of the probe with contact pads on the electronic element by urging the substrate and electronic element towards one another so as to deform the leads and the encapsulant layer.

While the terminals are engaged with the contact pads, the electronic device is actuated so that signals are sent between the electronic element and the circuitry on the substrate through the engaged contact pads and terminals and through the leads. The electronic element maybe a relatively large element such as a printed wiring board or semiconductor device such as a wafer, including a multiplicity of semiconductor chips, each having contact pads. In the latter case, the terminals of the probe maybe simultaneously engaged with the contact pads of a plurality of the chips in the wafer. Most preferably, the terminals of the probe are simultaneously engaged with the contact pads with all of the chips in the wafer. Stated another way, the preferred methods according to this aspect of the invention provide the capability of conducting a true wafer-level test.

The probe card can be fabricated with leads and terminals, the terminals being connected at a close terminal to terminal spacing or "pitch" corresponding to the pitch of the contact pads on a wafer. Moreover, as further discussed below, the locations of the terminals can be controlled precisely during fabrication of the probe card. Also, the probe card can be fabricated in a relatively large size comparable to the size of an entire wafer or the size of an entire printed wiring board. These and other objects, features and advantages of the present invention will be more readily apparent from the detailed description of the preferred embodiments set forth below, taken in conjunction with the accompanying drawings.

In its preferred forms, the present invention provides a novel, yet inexpensive probe card for the testing of single chips, full undiced wafers or other electronic components. The resulting probe card structure allows the probe card terminals to be located anywhere thereby allowing the testing of chips that have peripherally located chip contacts, area array chip contacts or non-uniformly arranged chip contacts, as well as wafers incorporating such chips.

DETAILED DESCRIPTION OF THE PREFERRED EMBODIMENTS

Figure 1A:
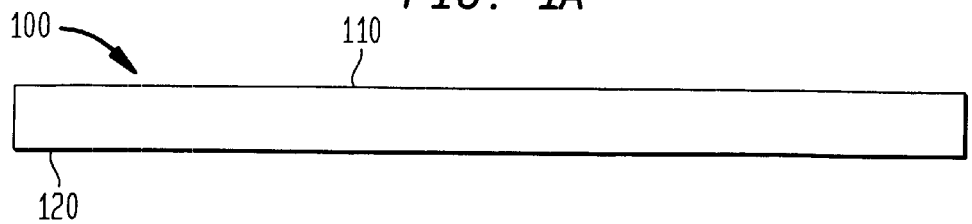
FIGS. 1A–1H are diagrammatic sectional views depicting a probe card in accordance with one embodiment of the present invention during successive stages of the probe card manufacturing process in accordance with a preferred embodiment of the invention.

FIGS. 1A through 1H show a method for manufacturing a probe card having flexible lead connections in a compliant layer matrix. FIG. 1A shows a dimensionally stable sacrificial layer 100. The sacrificial layer 100 can be electrically conductive or dielectric. Desirably, the coefficient of thermal expansion ("CTE") of the sacrificial layer is known and predictable over a range of temperatures so that it can be approximately matched to the CTE of the substrate 170, described below. Preferably, the sacrificial layer 100 is a readily etchable metallic layer, such as a copper or aluminum layer. However, the sacrificial layer could also be comprised of materials such as silicon or ceramic, or polymeric materials. The sacrificial layer has a first or top surface 110 and a second or bottom surface 120. Terms such as "bottom"; "top"; "upwardly"; and "downwardly", as well as "horizontal" and "vertical" are used in this disclosure as referring to the frame of reference of the components themselves, and need not have any relation to the gravitational frame of reference.

Figure 1B:
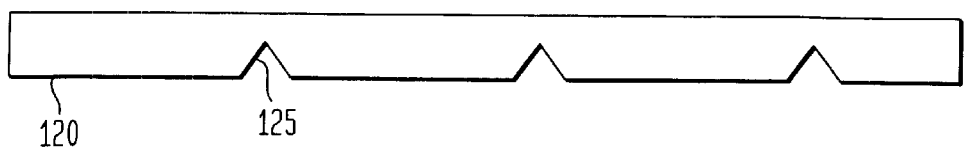

As shown in FIG. 1B, portions of the sacrificial layer 100 on the second surface 120 are selectively removed leaving concave portions 125 within the sacrificial layer 100. The concave portions will be used to create and shape the probe terminals so it is important that the shape of the concavity is the inverse of the desired shape of the probe terminal (as described below). In this example, the shape of the concave portion 125 in FIG. 1B is conical; however, many other shapes could be created if desired. For example, the concave portions 125 could have a more rectangular or box-like shape or could be semi-spherical in shape.

Figure 1C:
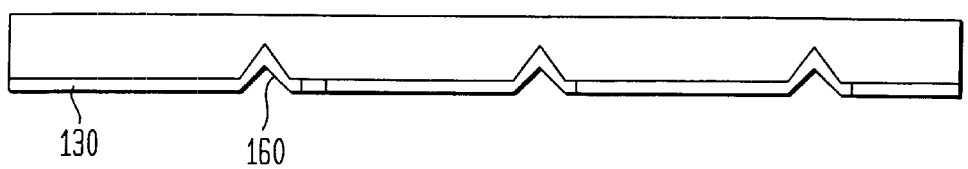

In FIG. 1C, a conductive layer 130 is conformally electroplated on the second surface 120 of the sacrificial layer 100 and within the concave portions 125. If the sacrificial layer 100 is made of a dielectric material, a seed layer must first be sputtered on the second surface 120 and within the concave portions 125 so that that surface is conductive enough to begin the electroplating process. Preferably, the conductive layer 130 is pattern plated onto the sacrificial layer 100. In a pattern plating process, first a photoresist material is deposited on the second surface 120. The photoresist material is selectively exposed and developed such that areas of the photoresist are hardened and other areas are removed to expose the conductive surface of the sacrificial layer 100. The conductive layer 130 is then plated to the approximate thickness needed for the terminals and lead features within the areas on second surface 120 where the photoresist was removed. In an alternative process, the conductive layer 130 is nonselectively plated atop the second surface 120 of the sacrificial layer 100. In this alternative process, it is preferable to plate layer 130 using a metal which is readily etchable (such as copper) so that the terminals 160 and leads 150 features can be more easily defined from the conductive layer 120. In this case, photoresist material is exposed, developed and removed such that the photoresist material resides only over the areas that will define the terminals 160 and leads 150. The conductive layer 120 is then etched in a suitable etching solution to remove the undesired portions of the conductive layer 130 and define the terminals 160 and the lead 150 features.

Figure 1D:
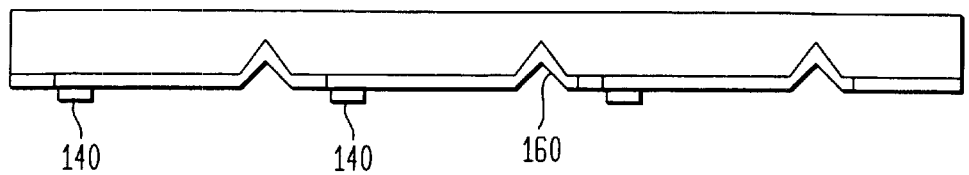

A typical example of thickness for the conductive layer is from 8 μm to 20 μm. The leads and terminals are preferably comprised of a highly conductive, ductile metal, such as copper or gold. However, they may also be comprised of a high strength metal with resilient or "spring-like" qualities. Another possibility is the leads and terminals can be comprised of a super-elastic material, such as certain nickel-titanium combinations. The next step in the process, as shown in FIG. 1D, is that a joining material 140 is disposed on selected areas of the conductive layer 120. The joining material 140 may be sputtered or electroplated onto the conductive layer 120. Alternately, the joining material may be placed on the conductive layer 120 by other conventional means. One example of such an alternate means is stencil printing of a metal filled adhesive material. As further discussed below, the joining material 140 on the lead ends serves to bond the lead ends to contacts 180 of the substrate. Thus, in an alternate embodiment, the joining material may be carried on the contacts 180 instead of on the lead ends or in addition to the joining material on the substrate. Moreover, where the lead ends can be bonded to the substrate contact without the use of a discrete joining material other than the material of the leads themselves, the joining material may be omitted.

Figure 1E:
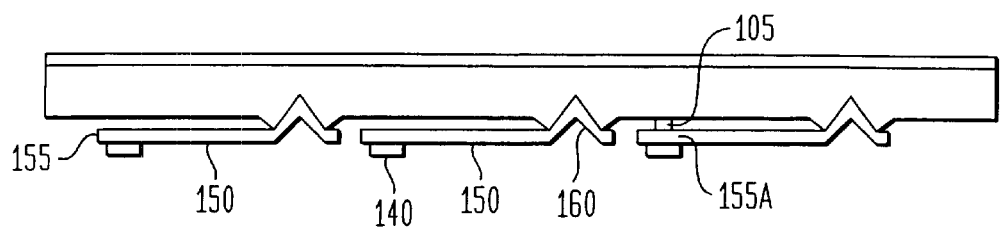
Figure 1F:
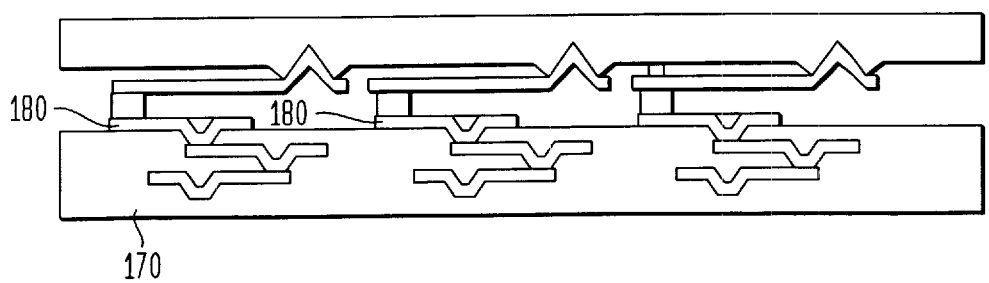

As shown in FIG. 1E, the second surface 120 of the sacrificial layer 100 is again etched so that the leads 150 cantilever above the surface of the sacrificial layer. For this step to be accomplished, it is important that the etchant used preferentially etches the sacrificial layer 100 over the lead and terminal 160 features. This can be accomplished by either using an etchant which does not etch the leads and terminals or etches the lead and terminals much more slowly than it etches the sacrificial layer 100. Typically, the first surface 110 of the sacrificial layer would be covered during this etching process to make sure that the sacrificial layer 100 is not over etched. In a preferable alternate method, the leads 150 have lead ends 155A which have larger dimensions in the horizontal directions parallel to the second surface than the rest of the leads 150. Lead ends 155A shield the underlying portions of the second surface 120 from attack by the etchant, thereby leaving small portions 105 of the sacrificial layer 100 in contact with each of the lead ends. Thus, each lead end is releasably attached to the second surface of the sacrificial layer by a small portion 105 of such layer. This is preferable because the leads are less likely to be bent or otherwise moved out of place prior to attachment to a substrate 170. It also more easily allows joining material 140 to be coupled to the corresponding substrate contacts 180 through the use of pressure, heat and/or ultrasonic energy, as shown in FIG. 1F.

A substrate 170 is next juxtaposed with the sacrificial layer and leads so that contacts 180 on the substrate are aligned with the second ends 155 of the leads. Thus, the joining material 140 is placed against corresponding substrate contacts 180. The lead ends and substrate contacts are joined through the application of heat, pressure or ultrasonic energy or a combination thereof, similar to the process described in the commonly assigned U.S. Pat. No. 5,518,964 (hereinafter "'964 patent"). Preferably, a low temperature method of joining the lead end to the substrate contacts (such as by using a conductive adhesive) is employed so that any misalignment of the lead ends 155 to their corresponding substrate contacts 180 caused by the differential of expansion and contraction of the substrate 170 and the sacrificial layer during the attachment process is insignificant. If a high temperature joining mechanism must be employed (such as an alloying or eutectic joint), the sacrificial material 100 is preferably comprised of a material which is CTE matched to the substrate 170 so that both materials expand and contract at approximately the same amount during the joining process. Stated another way, one limit on the temperature which can be used in the joining process is the difference in CTE between the substrate and sacrificial layer; the smaller such difference, the greater the temperature which can be employed. Desirably, the relative displacement of the lead ends 155, 155A and substrate contacts 180 due to differential thermal expansion in the joining process is substantially less than the dimension of an individual substrate contact, and substantially less than the distance between adjacent contacts.

As stated above, one low temperature joining material 140 is metal filled conductive adhesive. Typically, such adhesives have a joining temperature in the range of 80° C. to 110° C. One high temperature joining material is eutectic bonding system such as gold-tin-gold where gold connections are plated on to both the lead ends 155 and the substrate contacts 180 and a tin layer is plated either on one side or the other so that when the lead ends are brought into contact with the substrate contacts 180 under the proper heat and pressure conditions, the joint will combine into an alloyed joint that has a higher melting point than any of its constituent parts alone. This particular type of joint typically has an alloying temperature in the range of 280° C. to 325° C. Another example of a possible joining material 140 is lead-tin solder, or other standard solder compositions. Lead-tin solder could be used at a lower temperature than the above described eutectic systems.

The substrate 170 typically has circuitry including a plurality of conductive traces 172 therein on multiple vertical planes interconnected by conductive vias 174. The substrate 170 may be made from an inexpensive dielectric material such as a standard reinforced epoxy, reinforced epoxy or BT (bismalimide triazine) material. It may also be comprised of a more expensive ceramic or silicon material, especially if active devices are desired in the substrate circuitry.

Figure 1G:
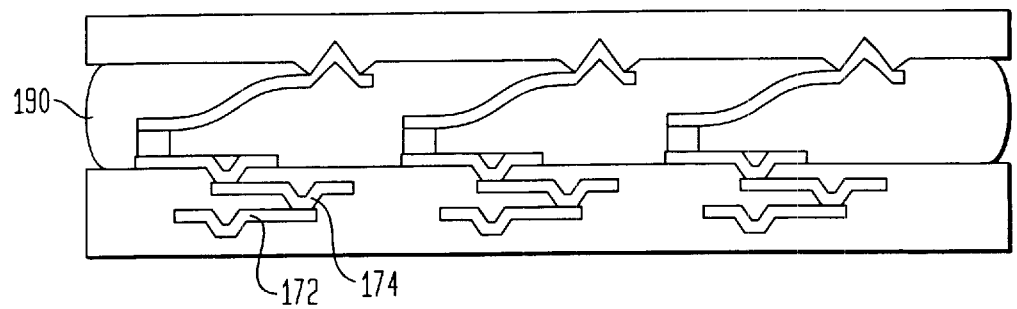

As shown in FIG. 1G, sacrificial layer 100 and substrate 170 are moved away from one another in a vertical direction, and a liquid encapsulant 190 is injected or otherwise dispensed between the sacrificial layer 100 and the substrate 170. Preferably, the pressure of the injected encapsulant 190 causes the sacrificial layer 100 and the substrate 170 to move vertically away from one another. The sacrificial layer and substrate may also be moved in horizontal directions during such vertical movement. The motion of these components desirably leaves each lead in a curved configuration such as an "S" shape between the terminal 160 and the substrate contacts 180. During this relative motion, the ends 155 of the leads are pulled away from the sacrificial layer. If the leads are held by the small portions 105 of the sacrificial layer, the relative motion of the components breaks the small frangible link 105 as the sacrificial layer 100 and the substrate 170 move away from one another. The encapsulant 190 is then cured, such as by applying heat or a chemical curing agent. The cured encapsulant acts as protection for the leads and to spread any localized stress on the leads during operation of the probe card device along the length of each of the leads. Preferably, the encapsulant is a highly compliant material, such as silicone or a flexibilized epoxy material. However, more rigid material may be used as well in applications where compliance is required to a lesser degree or is not required at all.

Figure 1H:
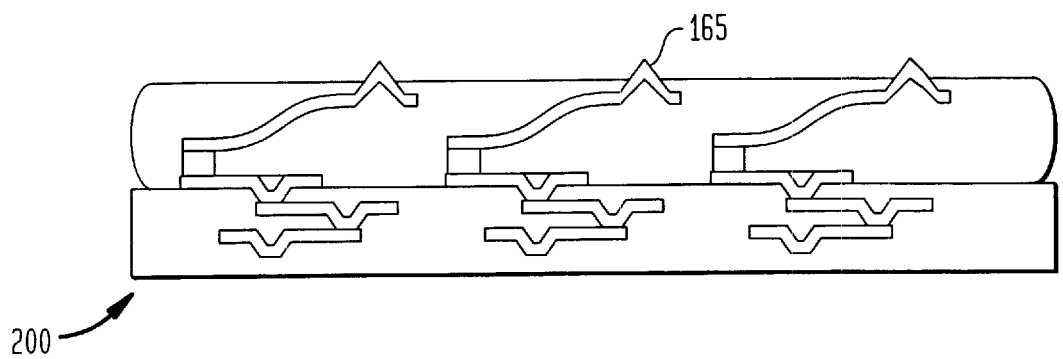

The last step in the process is to remove the remaining portions of the sacrificial layer 100, as shown in FIG. 1H, so that the tips 165 of the terminals 160 are exposed at an exterior surface of the finished probe card 200. Alternately, if the sacrificial layer 100 is a dielectric material, only selected portions of the sacrificial layer 100 might be removed (and the sacrificial layer 100 might be thinned) such that the remaining portions of the sacrificial layer 100 help provide added cohesion between the elements of the tips 165 of the terminals to the rest of the elements of the probe card 200. In a further alternate embodiment, in which the sacrificial layer 100 is a conductive material, the sacrificial layer 100 might be selectively removed (as described above) and act as a ground or power plane for the probe card 200 so as to reduce any stray capacitance or inductance. In a still further alternate embodiment, such remaining portions of the sacrificial layer 100 may have portions which extend into the cured encapsulant 190 to act as anchors for the remaining portions of the sacrificial layer 100 holding them fast to the surface of the encapsulant 190. In yet another alternate embodiment, the sacrificial layer may be selectively removed so as to leave portions of the sacrificial layer as terminals overlying terminals 160. These portions may be etched so as to form pointed tips, which can serve as the terminals of the wafer probe card. Formation of terminals from a reinforcing element is described in copending, commonly assigned U.S. patent application Ser. No. 08/989,312 filed Dec. 12, 1997, the disclosure of which is also incorporated by reference herein.

The substrate is then typically connected to a testing unit for actual use of the device. The conductive traces 172 are then connected to a testing unit (not shown) or other external circuitry in order to test probed electronic elements such as individual semiconductor chips, full undiced wafers or PWB boards. In the embodiments discussed above, the terminals 160 can be created in an area array, i.e., an array of terminals 160 disposed throughout a region of the probe card, rather than only along edges of the card. Such an area array can include terminals 160 at a small pitch or center-to-center distance. Therefore, a chip or wafer having contacts disposed in a high density area may be contacted and tested by this probe card.

Certain embodiments of the probe card may have non-oxidizing terminals either because the leads 150 and terminals 160 comprised of such a material (e.g. gold) or because such a material has been plated on the tips 165 of the terminals 160. Alternately, the tips of the terminals may be plated with a rugged metal, such as osmium or rhodium, to give the terminals added hardness. This allows the terminals to retain sharp features, such as pointed tips 165, despite repeated engagement with contacts of numerous electronic elements in service. The presence of such sharp features increases the ability of the terminals to break through any oxide layer on the engaged contact pads which the terminals are engaged with the contact pads, and helps to assure reliable electrical connections.

The leads 150 may be shaped in any shape that meet the pitch (center to center distance) between two adjacent leads that is required for a particular application. Examples of such alternate lead shapes include spiral and U-shaped leads. Other examples can be found in the '964 patent and in U.S. patent application Ser. No. 08/712,855 and 08/927,601, hereby incorporated by reference herein. Copending, commonly assigned U.S. patent application Ser. No. 08/989,582, also incorporated by reference herein, discloses further improvements in such processes. In the preferred arrangements taught in the '582 application, restraining straps which are shorter and stronger than the leads constrain the motion of the elements as they move away from one another to deform the leads. Similar restraining straps can be provided between the sacrificial layer and the substrate in a process according to this application.

The terminals shown in FIG. 1H have a concave back portion because of the conformal electroplating operation shown in FIG. 1C. In alternate embodiments, however, the terminals may be solid. Such solid terminals may be made by depositing the material used to form the terminals into the cavities 125 so that the material completely fills the cavities. Such solid terminals are more likely to resist breaking under pressure as the probe is engaged with the contacts of an electronic element.

In another alternate embodiment, the sacrificial layer 100 may be used as a mandrel in which a pattern is first embossed. The leads 130 and terminals 160 may then be plated thereon. Such sacrificial layers 100 may be comprised of wax or thermoplastic material that has been dimensionally stabilized by adding at least one metal layer thereto. Alternately, an embossing process can be used to form a pattern in a metallic sacrificial layer. In yet another embodiment, the sacrificial layer can be formed by plating or otherwise depositing the material of the sacrificial layer onto a master form, which is then stripped away from the formed sacrificial layer.

Figure 2:
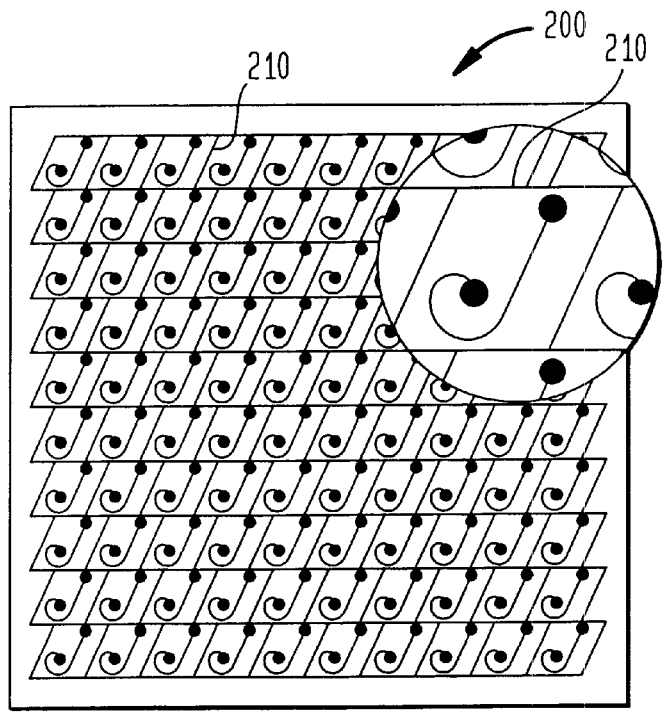
FIG. 2 is a diagrammatic top view of a probe card in accordance with the preferred embodiment of the invention.

FIG. 2 shows a top view of a preferable embodiment of a probe card 200, according to the present invention. In this figure, the step of forming a channel 210 in the encapsulant layer between each of the adjacent lead/terminals has been added to the card manufacturing process. Channels 210 facilitate independent movement of each lead and terminal independently with respect to the adjacent leads and terminals when the terminals are engaged with the contacts of the electronic element to be tested. Preferably this process step is accomplished using a laser to accurately ablate the cured encapsulant 190 without also ablating the substrate 170. The terminal pitch and dimensions of the leads should allow adequate space for the channels. To facilitate laser cutting, the substrate 170 may have a layer on its surface which reflects the radiant energy of the laser. One such layer is a copper layer on the surface of the substrate 170 around the substrate contacts. If a $CO_2$ laser is then used, it will ablate the encapsulant material but be reflected by the copper layer. Alternately, the channel 210 may be created by a high speed controlled depth cutting saw, abrasive jet cutting apparatus or water jet cutting apparatus. As also shown in FIG. 2, each lead is curved both in horizontal and vertical directions.

Figure 3:
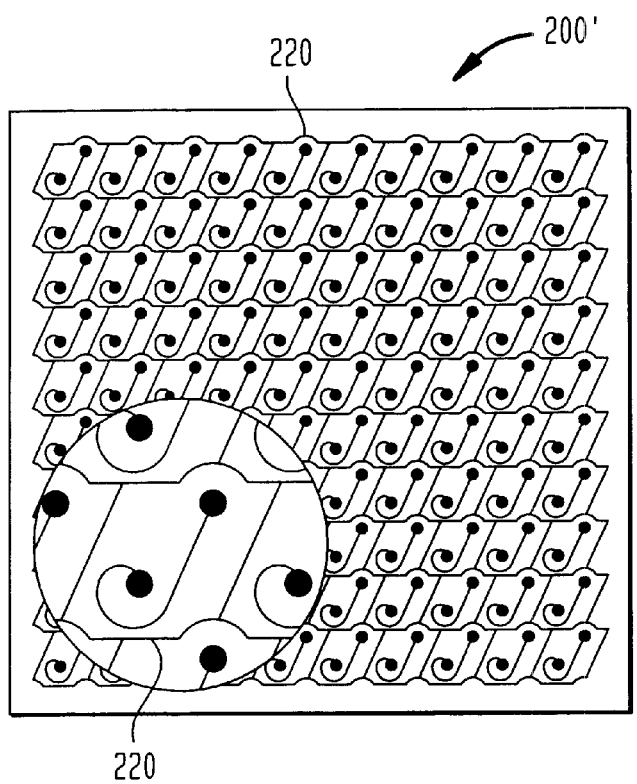
FIG. 3 is a view similar to FIG. 2 but depicting a card in accordance with yet another embodiment of the invention.
Figure 4:
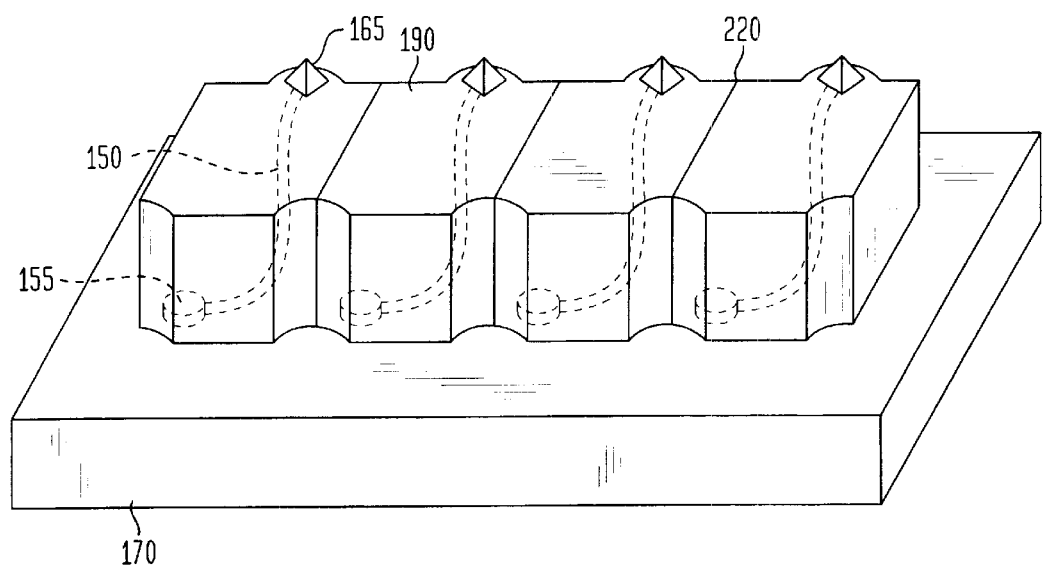
FIG. 4 is a diagrammatic perspective view depicting portions of the card shown in FIG. 3.

FIG. 3 shows a top view of an alternate probe card in which the lead/terminal combinations are disposed in rows, the rows being offset from one another such that the terminals in each row are nested between the leads in the next row. The channels 220 are likewise ablated around the terminal structures in between successive rows of leads. FIG. 4 shows a perspective, magnified view of a portion of the probe card shown in FIG. 3.

Figure 5A:
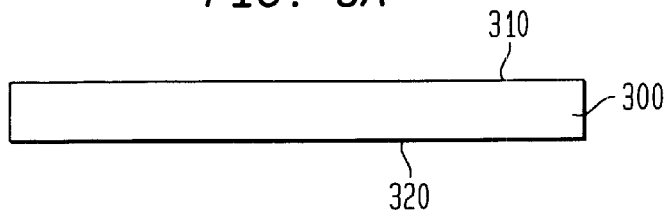
FIGS. 5A–5G are fragmentary diagrammatic sectional views depicting portions of a probe card in accordance with a further embodiment of the invention during successive stages of the manufacturing process in accordance with a further embodiment of the invention.
Figure 5B:
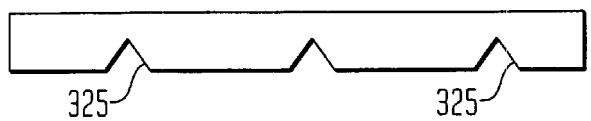
Figure 5C:
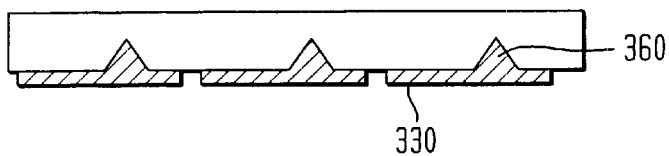

In a further variant, each lead 150 may include a polymer layer (such as polyimide) in the form of an elongated strip and a conductive layer such as a metallic strip on the polymer strip, desirably on a major surface of the strip. FIGS. 5A through 5G show one preferable method of manufacturing such a polymer lead with a polymer layer used in a probe card. This method is similar to the methods described above. In FIG. 5A, a sacrificial layer 300 is used. Preferably, the sacrificial layer is a readily etchable material that is also electrically conductive, such as copper or aluminum. The sacrificial layer has a first surface 310 and a second surface 320. As shown in FIG. 5B, concave portions 325 are etched into the second surface 310 of the sacrificial layer 300. Preferably, the metallic lead conductors 330 are next selectively pattern plated on the second surface 310 of the sacrificial layer and terminals 360 are electroplated in the concave portions 325, as shown in FIG. 5C. In this embodiment, the terminals are plated as solid elements and the lead conductors and terminals are plated with a ductile metal, such as copper or gold. However, the lead conductors and terminals may also be comprised of a high strength metal with resilient or "spring-like" qualities. Alternatively, the lead conductors and terminals can be comprised of a super-elastic material, such as certain nickel-titanium combinations.

Figure 5D:
Figure 5E:
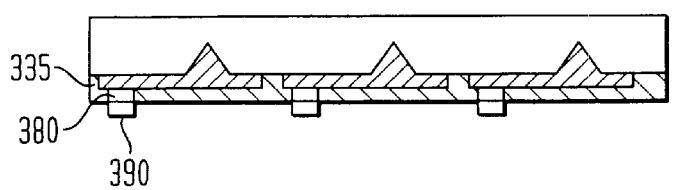
Figure 6:
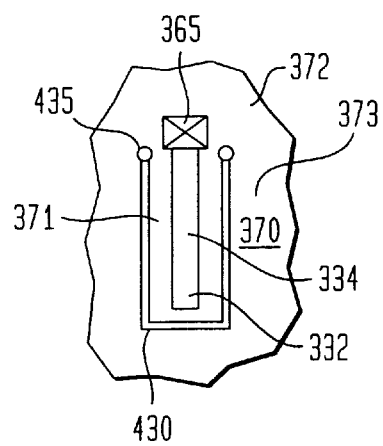
FIG. 6 is a fragmentary diagrammatic top view depicting portions of the probe card shown in FIGS. 5A–5G.

As shown in FIG. 5D, a layer 370 of polyimide resin is conformally spun coat (using conventional spin-coating techniques) onto the second surface 320 of the sacrificial layer 300 and onto the lead conductors 330 and terminals 360 and the resin is cured. Apertures 380 are created in the polyimide layer 370 such that the ends of lead conductors 330 at the distal ends or second ends 335 of the lead conductors remote from terminals 360 are exposed at the bottom surface of layer 370, i.e., the surface facing away from the sacrificial layer. The apertures 380 can be created using chemical etching or laser ablation techniques. A conductive bump/joining material 390 is then electroplated into the apertures 380, as shown in FIG. 5E. A generally U-shaped channel 430 is also created around each lead conductor 330, as shown in FIG. 6. Preferably, both the aperture 380 and the channel 430 are created during a single laser ablation operation. If a $CO_2$ laser is used, the sacrificial layer 300 is comprised of copper and the leads are comprised of gold, the laser will ablate the polyimide layer 370, but the laser energy will be reflected by both the lead conductors 330 and the sacrificial layer 300 so both will remain unharmed. The U-shaped channels subdivide layer 370 into polymeric strips 371 extending along the lead conductors 330 and a main region 373. Thus, composite leads 375 are formed. Each such composite lead includes a polymeric strip 371 and a metal conductor 330.

Figure 5F:
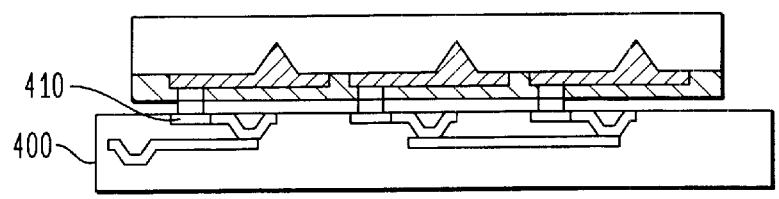

As shown in FIG. 5F, the conductive bumps/joining material 390 is aligned, abutted against and coupled to substrate contacts 410 on substrate 400 in the manner discussed above with reference to FIG. 1F. For the reasons described above, a low temperature joining material 390 is preferred. However, if the sacrificial layer 300 can control the movement of the elements attached thereto due to thermal expansion and maintain alignment of the components at a high temperature, a high temperature joining method can be used as well.

Figure 5G:
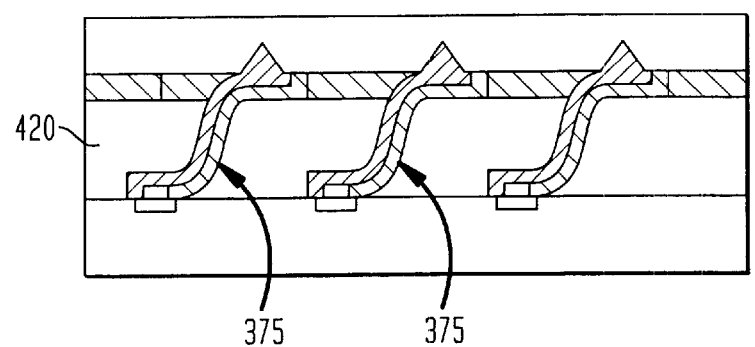

After the second ends 335 of the lead conductors are coupled to the substrate contacts 410, a liquid encapsulant 420 is injected between the sacrificial layer 300 and the substrate 400 thereby causing the composite leads 375 to pull away from the second surface 320 of the sacrificial layer 300, as shown in FIG. 5G. The encapsulant material is then cured in order to form an encapsulant layer which acts to protect the leads and spread any localized stress on the leads during operation of the probe card. The sacrificial layer 300 is then removed, as by an etching operation, to reveal the probe terminal tips 365 for engagement with contact pads on an electronic element.

Preferably, cylindrical holes 435 are provided the ends of the legs of each U-shaped channel 430 such that each hole 435 has a diameter slightly larger than the width of the channel itself. This will help stop any ripping of the polyimide during operation of the probe card.

In one preferable alternate embodiment, the second surface 320 of the sacrificial layer 300 is treated such that the leads 330 do not adhere well to the second surface 320. This can be accomplished by plating a thin layer of material on the second surface 320, but not in concave portions 325, prior to any other operations. When the terminals are electroplated into the concave portions 325, the terminals 360 should still be able to adhere well to the side walls of the concave portions 325 because no adherence inhibiting layer will have been added thereto. Thus, even if the leads lose their adherence to the sacrificial layer during further processing, the terminals 360 and the polyimide layer 370 should provide enough adherence to anchor the first or terminal leads of composite leads 375 in place. However, after the channels 430 are ablated, the adherence of the second or distal ends 335 of leads 375 to the sacrificial layer will be reduced such that the force of injection of the encapsulant will allow the second ends of the leads to peel away from the sacrificial layer 300.

In certain variants, the lead could have two or more conductive layers, such as conductive layers on both major surfaces. Multiconductor leads can provide for differential signaling over the plural conductors of the lead or to provide a ground conductor which lies immediately adjacent the signal conductor on the same lead. Leads of these type, and manufacturing processes for making such leads, are described in copending, commonly assigned U.S. patent application Ser. Nos. 08/695,875; 08/715,571; 09/020,754; and 09/140,589, all of which are incorporated by reference herein. As described in greater detail in the copending applications, it is desirable to connect the multiple conductors of such a lead to closely-spaced contacts on a chip or other electronic element. For example, the chip may have a set of adjacent contact pads connected to a common internal circuit within the chip as, for example, to the positive and negative outputs of an amplifier. The terminals associated with the multiple conductors of a single lead in a probe card according to this embodiment of the present invention may be closely spaced so that these terminals can be engaged with the set of adjacent contact pads on the chip, thereby connecting the internal circuit of the chip to the probe card through the multiple conductors of a single lead. As discussed in greater detail in the copending applications, this provides a controlled-impedance signal path which markedly enhances operation at high signal frequencies. Use of this arrangement in the probe card is particularly advantageous where the electronic element to be tested must operate at high signal frequencies; the probe card can provide operation at the real signal frequencies which will be encountered in service of the electronic element, and thereby provides a more realistic test. This is particularly advantageous where the signals which must pass through the leads include signals at about 50 MHz or more, and is even more advantageous at even higher signal frequencies, such as above about 100 MHz or above 200 MHz.

Figure 7:
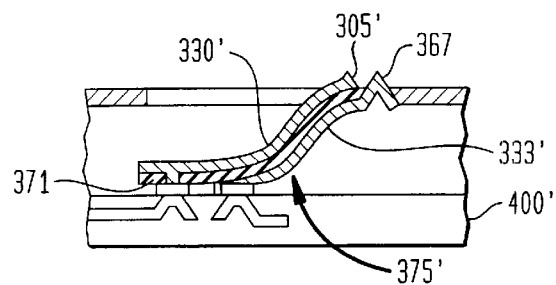
FIG. 7 is a fragmentary diagrammatic sectional view depicting portions of a probe card in accordance with a further embodiment of the invention.

One example of a test probe incorporating multiconductor leads is shown in FIG. 7. In this embodiment, a second conductive layer is provided on the surface of the polyimide layer 370' facing the substrate 400', and formed into additional conductors 333', so that each composite lead 375' includes two lead conductors 330' and 333' on opposite sides of a polymeric strip 371. The two conductors of this lead are electrically connected to a set of closely-spaced terminals 365' and 367', which can be engaged with closely-spaced contact pads on a chip or other element being tested. This extra conductive layer could be used as a ground plane, a power plane or as added leads for differential signaling operations, as disclosed in copending, commonly assigned U.S. patent application Ser. Nos. 08/715,571; 09/020,754 and 09/140,589, the disclosures of which are hereby incorporated by reference herein.

In a further variant (FIG. 8), the probe card can include a flexible dielectric layer 502 overlying the compliant encapsulant 504. During fabrication of the probe card, the leads 508 can be provided on a bottom surface 506 of a flexible dielectric layer, in an arrangement generally similar to certain preferred embodiments shown in the aforementioned U.S. Pat. No. 5,518,964. In this arrangement, the leads 508 initially extend bottom surface 506 of the flexible dielectric layer. Terminals 510 are exposed to the top surface of the dielectric layer, and desirably protrude upwardly above the top surface as shown. Desirably, the terminals have points, sharp edges, asperities 511 or other sharp features to facilitate engagement with the electronic element to be probed.

Figure 8:
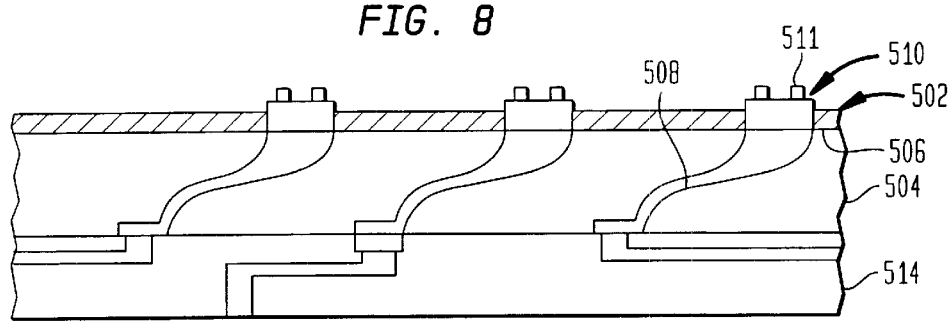
FIG. 8 is a fragmentary diagrammatic sectional view depicting portions of a probe card in accordance with yet another embodiment of the invention.

The dielectric layer is assembled to substrate 514, and the ends of the leads are bonded to the substrate, whereupon the substrate and flexible element are moved away from one another and the encapsulant is injected between the substrate and dielectric layer, thereby bringing the assembly to the condition depicted in FIG. 8. The flexible dielectric layer may remain in position after these steps. In a further variant of this approach, a releasable bond between a lead and the surface of the dielectric layer is formed by etching the dielectric material, as disclosed in certain preferred embodiments of copending, commonly assigned U.S. patent application Ser. No. 09/020,750, filed Feb. 9, 1998, the disclosure of which is also incorporated by reference herein.

Figure 9:
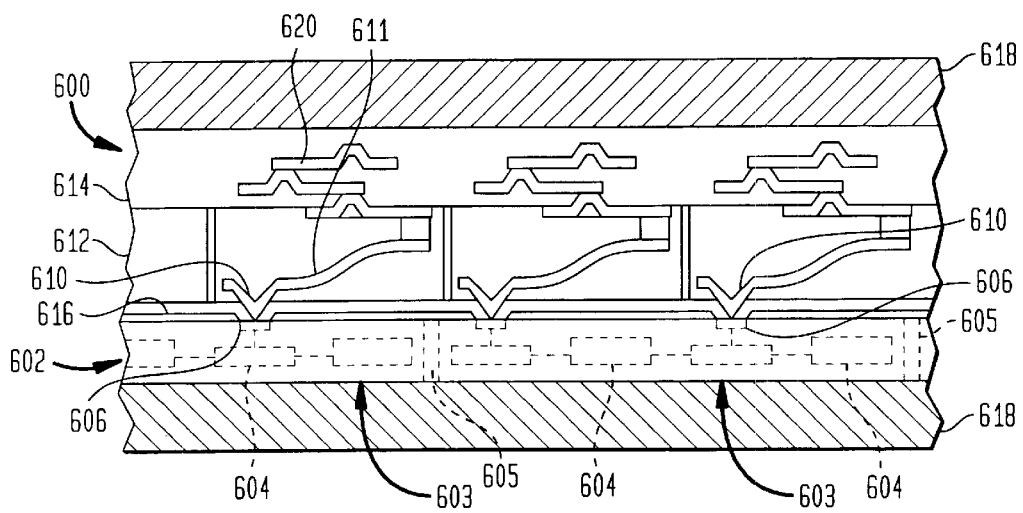
FIG. 9 is a fragmentary sectional view depicting portions of a probe card and an electronic element during a testing procedure in accordance with a further embodiment of the invention.

A procedure for testing an electronic element such as those described above is diagrammatically illustrated in FIG. 9. A probe card 600, which may have any of the configurations discussed above, is engaged with an electronic element 602 which in this case is a wafer incorporating numerous semiconductor chips 603 having internal electronic devices 603 and contact pads 606. The chips are delineated from one another by scribe lines 605. The wafer is arranged so that those electronic devices form functional parts of the individual chips are disposed outside of the scribe lines. In the testing method, the probe card 600 is engaged with the electronic element or wafer 602 by disposing the probe card with the wafer so that the terminals 610 are aligned with the contact pads 606 on the wafer and so that the encapsulant layer 612 is disposed between substrate 614 and the front, contact pad-bearing surface 616 of the electronic element.

The substrate 614 is urged toward the electronic element 606. For example, the substrate and electronic element maybe squeezed together by a pair of platens 618. Other elements such as fluid pressure devices weights, springs or essentially any other device capable of applying force could be used to urge the substrate and the electronic element together. As the substrate is urged towards the electronic element, the terminal 610 are urged into engagement with the contact pads 606 of the electronic element. The encapsulant layer 612 and leads 611 can deform so that terminals 610 can move. Such movement can include movement in a vertical direction, towards and away from the substrate 600. This allows the terminals to accommodate differences in height of the contact pads 606 as, for example, where the wafer front surface 616 is out of plane and allows reliable, consistent engagement with the contact pads 606 on the wafer.

While the terminals are engaged with the contact pads, the electronic devices within the wafer are actuated by sending signals through the circuitry 602 of the probe card and through the leads 611 and terminals 610 into and out of contact pads 606, so that signals pass to and from the electronic devices 604 of the wafer. The term "signals" as used herein should be understood broadly as including both time-varying signals of the type commonly used as inputs and outputs and also including constant potentials such as ground and power potentials which must be supplied to or taken from the electronic element under test.

After completion of the test, the wafer is separated from the probe card and the individual chips are separated from one another as by cutting along scribe lines 605.

As described above, the present probe array contactor can be used to test single chips having peripheral or area array contacts. It can also be used to test all or part of a full undiced wafer simultaneously. Alternately it could be used to test printed wiring boards ("PWBs") and or assembled packages, such as ball grid array ("BGA") packages.

What is claimed is:

1. A method of testing an electronic element comprising:
   (a) providing a probe card including a substrate having electrical circuitry thereon, a encapsulant layer overlying a surface of said substrate, and a plurality of leads permanently bonded to said electrical circuitry extending upwardly from said substrate through said encapsulant layer, said leads having terminals remote from said substrate projecting from said encapsulant layer said leads having flexible portions disposed within the encapsulant layer;
   (b) temporarily engaging said terminals with contact pads on the electronic element by urging said substrate and said electronic element towards one another, so as to deform said flexible portions of said leads and said encapsulant layer; and
   (c) while said terminals are engaged with said contact pads, operating said electronic element so that signals are sent between said electronic element and said circuitry on said substrate through said engaged contact pads and terminals and through said leads.

2. A method as claimed in claim 1 wherein said electronic element is a printed wiring board.

3. A method as claimed in claim 1 wherein said electronic element is a semiconductor device.

4. A method as claimed in claim 1 wherein said semiconductor device is a wafer including a multiplicity of semiconductor chips each including contact pads, said terminals of said probe being simultaneously engaged with the contact pads of a plurality of the chips in the wafer during said engaging step.

5. A method as claimed in claim 4 wherein said terminals of said probe are simultaneously engaged with the contact pads of all of the chips in the wafer in said engaging step.

6. A method as claimed in claim 1 wherein said terminals on said probe card includes sets of closely-spaced terminals and said leads on said probe card include multiconductor leads, at least some of said multiconductor leads being connected to said closely-spaced terminal sets so that the conductors on each such multiconductor lead are connected to terminals of the same set, the terminals of said closely-spaced sets being engaged with adjacent contact pads on the electronic element.

7. A method as claimed in claim 6 wherein signals passing between said substrate and said electronic element through said multiconductor leads include signals having frequencies of at least about 50 MHz.

* * * * *